United States Patent [19]

Benasutti

[11] 4,418,972

[45] Dec. 6, 1983

[54] ELECTRICAL CONNECTOR FOR PRINTED WIRING BOARD

[75] Inventor: John E. Benasutti, North Wales, Pa.

[73] Assignee: Burroughs Corporation, Detroit, Mich.

[21] Appl. No.: 344,490

[22] Filed: Feb. 1, 1982

[51] Int. Cl.³ .............................................. H01R 9/09
[52] U.S. Cl. ............................ 339/14 R; 339/17 LM; 339/176 MP; 339/207 R
[58] Field of Search .......... 339/17 LC, 17 LM, 17 M, 339/75 M, 75 MP, 176 M, 176 MP, 14 R, 206 R, 207 R

[56] References Cited

U.S. PATENT DOCUMENTS

| | | | |
|---|---|---|---|
| 2,658,183 | 11/1953 | Klostermann et al. | 339/207 R |
| 3,149,893 | 9/1964 | Dupre | 339/17 LM |
| 3,634,816 | 1/1972 | Zell | 339/17 M |
| 3,660,803 | 5/1972 | Cooney | 339/17 LM |
| 3,871,728 | 3/1975 | Goodman | 339/14 R |
| 3,876,274 | 4/1975 | Ruehlemann et al. | 339/207 R |
| 3,966,290 | 6/1976 | Little et al. | 339/17 LC |
| 4,243,283 | 1/1981 | McSparran | 339/14 R |
| 4,314,736 | 2/1982 | Demnianiuk | 339/75 MP |

FOREIGN PATENT DOCUMENTS 1232014 4/1960 France .......................... 339/17 LC Primary Examiner—John McQuade
Assistant Examiner—Gary F. Paumen
Attorney, Agent, or Firm—Francis A. Varallo; Edmund M. Chung; Kevin R. Peterson

[57] ABSTRACT

The present disclosure describes an electrical connector for use with a printed wiring board. The connector design is characterized by an inner housing of insulative material for supporting a plurality of electrical contacts and an outer insulative structure which encloses the housing and is easily removable therefrom. The latter permits the cleaning of the electrical contacts after a soldering operation and also allows for the replacement of individual defective contacts. Additionally, if required for impedance or electrical interference considerations, the present connector utilizes an integral ground conductor plane which substantially encloses its outer insulative structure and is electrically connected to the ground plane of the printed wiring board.

5 Claims, 5 Drawing Figures

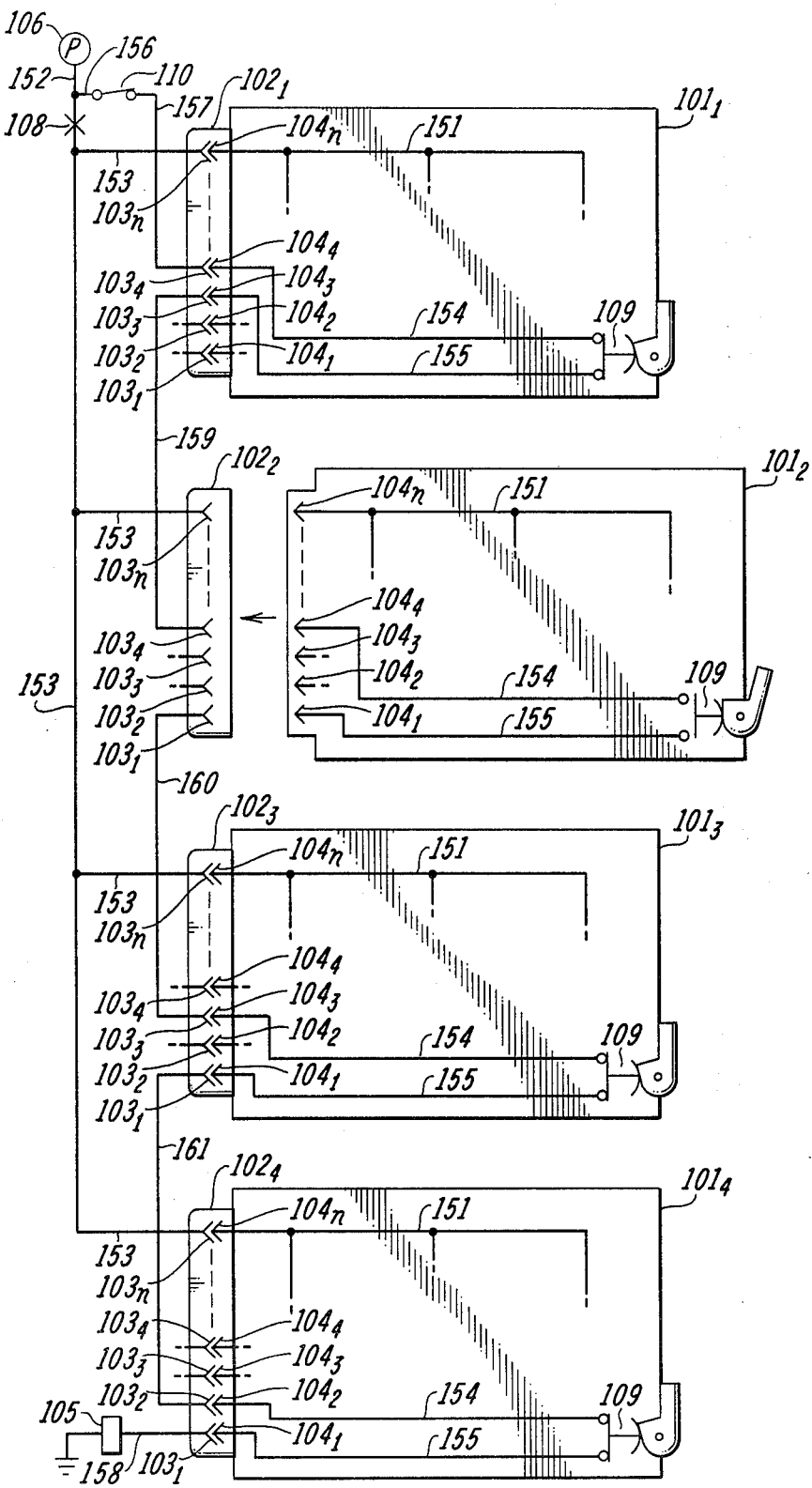

ELECTRICAL CONNECTOR FOR PRINTED WIRING BOARD

BACKGROUND OF THE INVENTION

Electrical connectors of many types are used extensively in the electrical and electronic fields. One application for such connectors is the providing of electrical current paths between an external medium and a printed wiring board. It has been found that during the soldering operation which attaches the electrical contacts of the connector to the printed wiring pads of the board, contamination of the contact surfaces is likely to occur. Such contamination is usually the result of solder flux which migrates onto the contact surfaces which engage the pins or terminals inserted into the connector. Flux on the aforementioned surfaces has an adverse effect on the signal current flow.

A subsequent problem encountered with connectors is that it may be necessary, in a field installation environment, to replace the entire connector because one or more of the electrical contacts have been damaged or are otherwise defective.

It is apparent from the foregoing that a need exists for an electrical connector which may be easily and repeatedly assembled and disassembled with no damage to its structural parts in order to provide for the cleaning of its electrical contacts after soldering or the replacement of individual ones of the contacts which are defective. Moreover, should the connector be used in an environment requiring impedance or electrical interference considerations, the shielding of the connector must be accomplished in a manner which will not preclude the disassembly thereof as noted hereinbefore. The connector of the present invention fills such a need.

SUMMARY OF THE INVENTION

In accordance with the present invention, an electrical connector is provided which includes means for fastening it to the edge of a printed wiring board. The connector may be used to provide electrical continuity between the board and a medium such as a wiring back plane.

The connector is comprised of individual inner and outer members formed of insulative material. The inner member or housing is comprised of a plurality of honeycomb-like cells oriented at right angles to the longitudinal axis of the housing. A plurality of electrical contacts are disposed in the respective cells. Each of the contacts includes a pair of opposed spring-like members, open at one extremity and terminating at the opposite extremity in a common elongated tail. The latter protrudes from a slot formed in the rearward wall of the housing. The latter wall also includes a longitudinally disposed groove for receiving the edge of the printed wiring board. The tail sections of the respective electrical contacts may then be soldered to pads along the periphery of the board. Since the outer insulative member has not yet been assembled to the housing, the contacts may easily be cleaned of contaminants such as solder flux, after the solder operation.

The outer insulator is a box-like member completely open on one side thereof to receive the housing, and having on its opposite side a plurality of apertures homologous with respect to the housing cells and the terminal-receiving extremities of the electrical contacts.

If desired, the connector may include an integral ground conductor plane in the form of a metallic shell placed over the surfaces of the outer insulating member and having pin-receiving apertures in substantial alignment with those of the latter member.

Whether or not the connector incorporates a ground conductor plane, the connector is held together by means which fasten it to the printed wiring board. Thus, the inner and outer insulative members are not fastened to each other, and may be assembled and disassembled repeatedly without any damage thereto. If the connector has no ground conductor plane, the outer insulative member is formed with at least one pair of tabs coplanar with the respective top and bottom surfaces thereof and extending over the printed wiring board. The tabs include respective pin-receiving apertures in substantial alignment with each other, and with an aperture in the wiring board. The placement of a pin through the aforementioned apertures, locks the connector onto the board which as noted hereinbefore, is further restrained by its edge disposed in the groove along the inner housing.

The use of a metallic shell over the connector eliminates the need for the tabs on the connector outer member. The metallic shell itself is pulled tightly against the top and bottom surfaces of the outer member and the coextensive extremities thereof are attached by one or more mechanical fasteners to the printed wiring board. In practice, the fasteners may penetrate the board and contact the integral ground plane of the latter, to provide electrical continuity between the connector and board ground planes.

The foregoing design is advantageous for the replacement of individual damaged contacts at field installations. Removal of the means fastening the connector to the board permits the outer insulative member to be removed from the inner member. The damaged contact can then be easily removed after desoldering its tail section from the wiring board pad. After the damaged contact has been replaced, the outer insulator is reassembled to the connector and the mechanical fasteners reapplied.

It should be noted that the use of the metallic shell as an integral ground plane reduces the electrical impedance of the signal paths established by the connector. Additionally, the ground conductor provides protection for electrical interferences such as electromagnetic interference (EMI), radio frequency interference (RFI), and as believed, the effects on current of nuclear radiation.

Other features and advantages of the connector of the present invention will become apparent in the detailed description which follows.

DESCRIPTION OF THE PREFERRED EMBODIMENT

Figure 1:
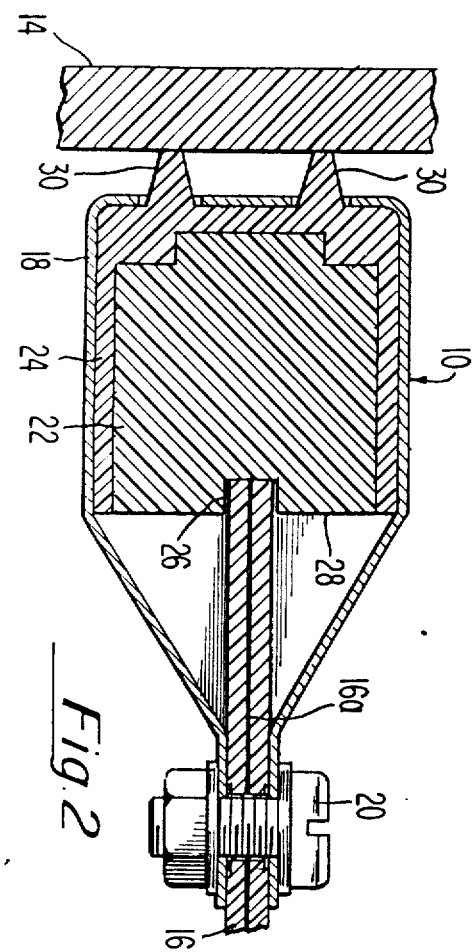
FIG. 1 is a top view of an embodiment of the connector of the present invention having an integral ground plane fastened to a printed wiring board, and having portions of the ground plane cut away.

With reference to FIG. 1, the electrical connector 10 of the present invention is shown in a typical operating environment. Thus, the connector 10 provides electrical continuity between a plurality of pins or terminals 12 mounted in a backplane 14 and a printed wiring board 16 contiguous therewith. A ground plane comprised of a metallic shell 18 encloses the connector 10 and is attached to the board 16 by fasteners 20. It should be understood that the environment depicted in FIG. 1 has been chosen solely for purpose of example, and is not to be considered limitative of the invention. For example, the backplane 14 may be replaced by a mating connector in certain applications.

Figure 2:
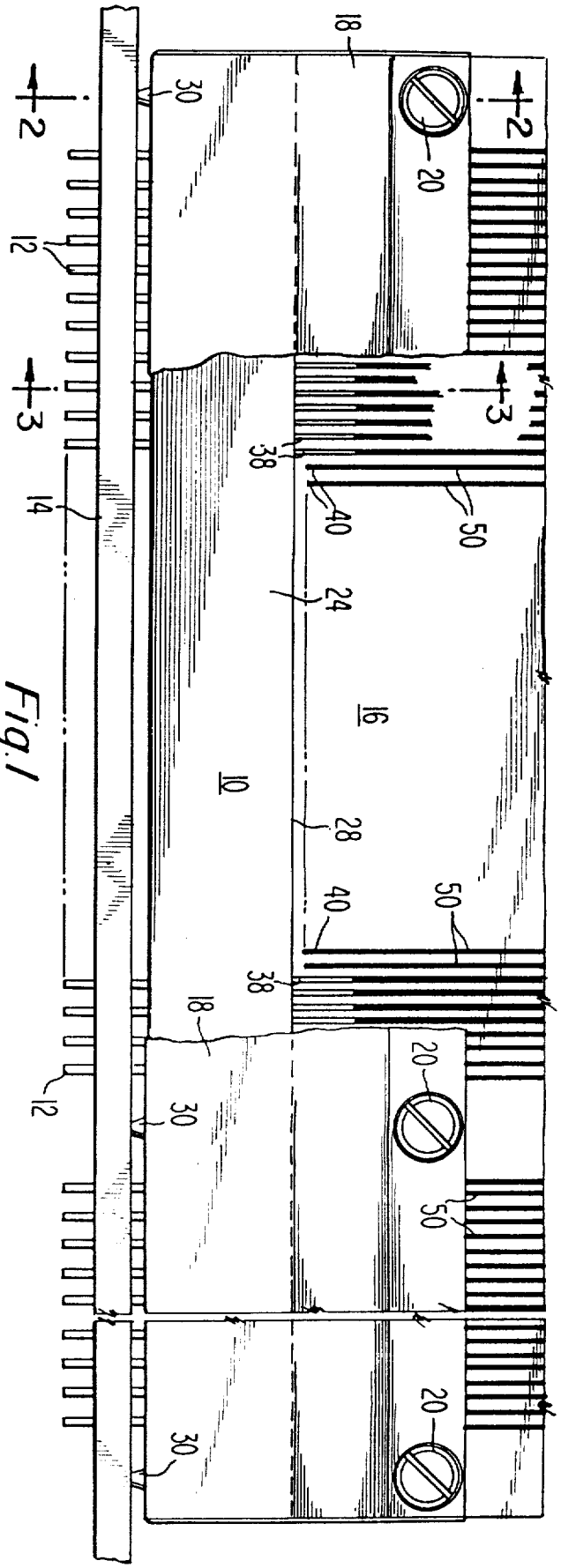
FIG. 2 is a section view taken along lines 2—2 of FIG. 1.

FIG. 2 provides more detail on the components depicted in FIG. 1. The connector 10 is comprised of an inner insulative member or housing 22 and an outer insulative member 24. The former member 22 includes a groove 26 which is longitudinally disposed in its rearward wall 28, for receiving the edge of printed wiring board 16. The outer member 24 has a plurality of substantially conical-shaped standoffs 30 formed thereon to prevent the surface of backplane 14, which may include metallized circuit conductors, from contacting the metallic shell 18. The shell 18 substantially encloses the connector 10 and provides, by virtue of the attachment of its extremities to board 16 by fastener 20, the assembly of the component members 22 and 24 of the connector to each other and their combination, to board 16. In addition to its mechanical function, fastener 20 normally contacts the ground plane 16a of the wiring board 16, thereby providing electrical continuity between the ground planes of the connector and the board.

Figure 3:
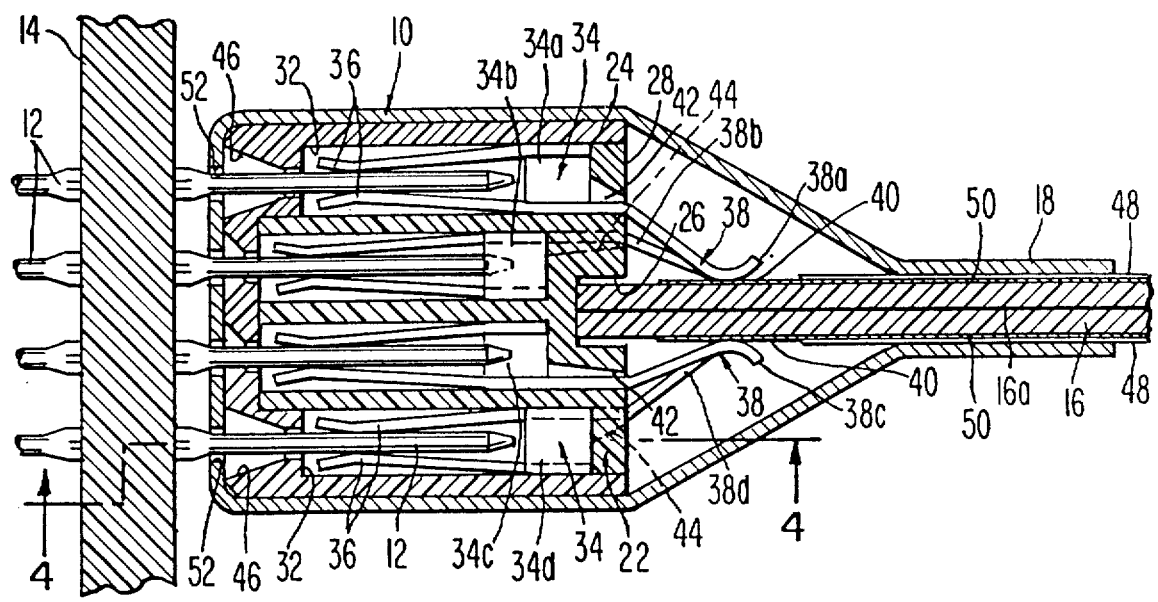
FIG. 3 is a further section view taken along lines 3—3 of FIG. 1.

The section view of FIG. 3 derived from FIG. 1 further illustrates the members 22 and 24 of the connector 10. The inner member or housing 22 is comprised of a plurality of honeycomb-like cells 32, arranged in rows and columns, for receiving respective electrical contacts 34. Four rows of cells 32 and their associated contacts 34 are shown disposed along the longitudinal axis of connector 10, in the manner illustrated in FIG. 5. Each of the contacts 34 is comprised of a pair of opposed spring members 36 which terminate at their rearward extremity in a common tail section 38 which is soldered to a metallized pad 40 along the edge of board 16. The tail sections 38 of contacts 34 are offset from the longitudinal center lines of the contacts 34 (as seen particularly in FIG. 4). Therefore, when the contacts in any given row are rotated 180 degrees about their longitudinal axes as compared with an adjacent row, the tail sections 38 of the two contacts in the same column will emerge from respective upper and lower slots in the rearward wall 28 of inner member 22 and be spaced apart as they engage the metallized pads 40 on the same side of board 16. For example, in FIG. 3, the tail section 38a of contact 34a emerges from a lower slot 42 in cell 32, and appears in front of the tail section 38b of contact 34b which emerges from an upper slot 44 in cell 32. Contact 34b is rotated 180 degrees about its longitudinal axis compared to contact 34a. Allowing the tail section 34a to emerge through the lower slot 42, results in a shorter electrical path in the contact which is desirable for high speed operation.

Figure 4:
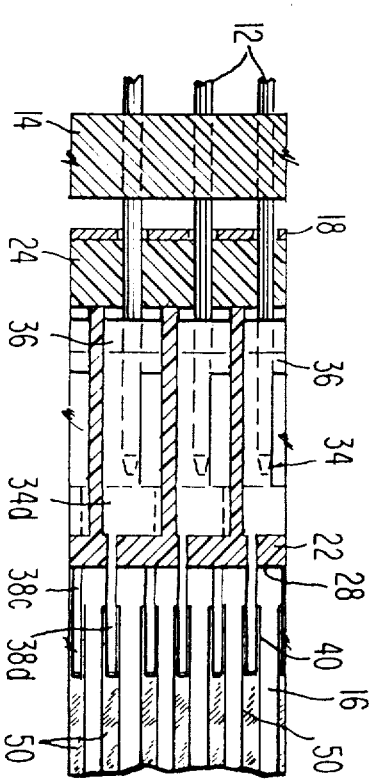
FIG. 4 is a section view taken along lines 4—4 of FIG. 3.

The section view of FIG. 4 derived from FIG. 3 further illustrates the alternate arrangement of contact tail sections as they appear on the underside of board 16. Thus, the tail section 38c of contact 34c is displaced from tail section 38d of contact 34d lying immediately above it in the same column. All of the tail sections 38 are soldered to the respective metallized pads on the surface of the wiring board 16.

Figure 5:
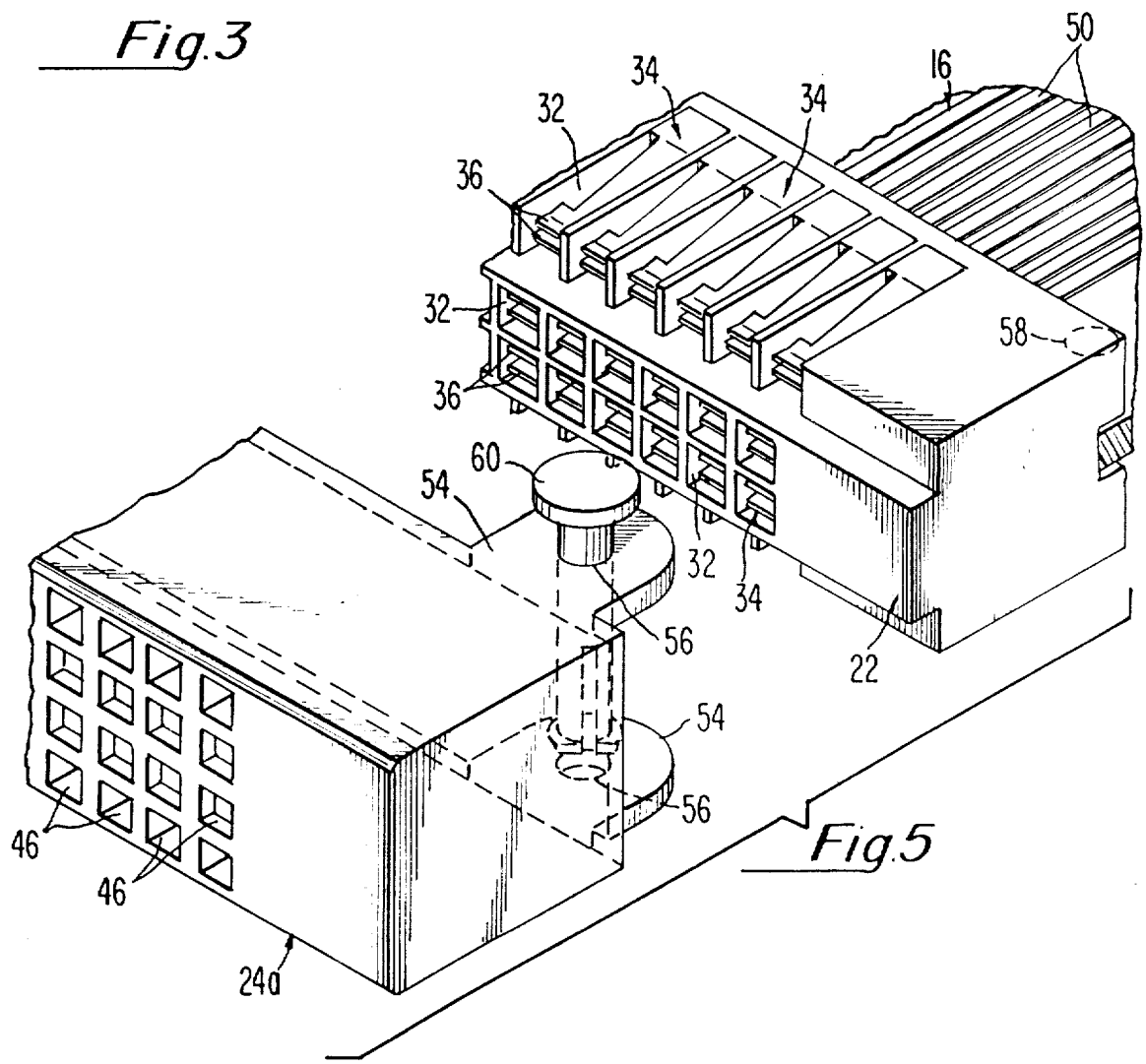
FIG. 5 is an exploded pictorial view of the connector generally applicable to the inner and outer insulative members of the embodiment of FIG. 1 but including the fastener means unique to an embodiment of the present invention which omits the ground plane illustrated in FIG. 1.

With continued reference to FIG. 3 and general reference to FIG. 5, the outer insulative member 24 is a box-like structure open on one side to receive the housing 22 and having on its forward side, a plurality of tapered apertures 46 homologous with respect to the cells 32 and the pin receiving extremities of contacts 34. The top and bottom rows of electrical contacts are recessed with respect to the middle rows and the tapered apertures in outer member 24 are formed with corresponding depths. This arrangement minimizes the pin insertion force, since all pins 12 do not engage all of the contacts 34 simultaneously.

The ground plate metallic shell 18 encloses the outer member 24 in FIG. 3, and is fastened to the board 16 as described previously in connection with FIG. 2. An insulation layer 48 disposed over the metallized lines 50 on the planar surfaces of board 16, prevents the metal shell 18 from shorting out the lines. Openings 52 in the shell 18 which are in alignment with the apertures 46 in the outer member 24 provides for the entrance of pins 12 into the connector 10. Pins 12 as illustrated, are of the well-known solderless, compliant type, which are press fitted into plated-through holes in the backplane 14.

FIG. 5 illustrates an embodiment of the connector of the present invention in which the ground plane shell 18 (see FIGS. 1–3) is omitted. The structure of the inner insulative member 22, its cells 32, and the contacts 34 are identical in both embodiments. Likewise, the outer insulative member 24a in FIG. 5 is the same as 24 in FIG. 3, except that it is formed with a pair of tabs 54 coplanar with the top and bottom surfaces thereof, and extending ovver the printed wiring board 16. The tabs 54 include respective pin-receiving apertures 56 in substantial alignment with each other, and with an aperture 58 in the board 16. A pin 60 is inserted through apertures 56 and 58 locks the connector 10 onto the board 16.

Assembly of the connector 10 is accomplished in a straightforward manner. A row of contacts 34 fabricated in a ribbon or band may be held in a suitable fixture, trimmed to separate the units and inserted simultaneously, tail-first into the cells 32 of the inner housing 22. The tail sections 38 may then be formed by an appropriate tool to facilitate their engagement with the pads 40 of the printed wiring board 16, to which they are soldered. After the solder operation, the exposed contacts may easily be cleaned to remove any solder flux residue, particularly on the contact fingers 36.

The housing 22 may then be placed within the outer insulative member 24, if a metallic shell 18 is to enclose the connector, or 24a if shell 18 is not required. In the former case, the coextensive extremities of the shell 18 are attached to the printed wiring board 16 by fasteners 20. In the latter, a pin 60 attaches the outer member 24a to the board.

Disassembly of the connector for the purpose of replacing a defective contact, is accomplished by reversing the above procedure. When the outer member 24 has been removed, the contact tail 38 is desoldered, the contact 34 is withdrawn from the cell 32, and a new one inserted in its place and soldered to the appropriate pad 40.

In conclusion, there has been described an electrical connector having general utility in a variety of applications, and providing the convenience of repeated assembly and disassembly with simple tools and with no damage to the structural members thereof. It is apparent that depending upon the particular application, changes and modifications of the connector may be required. Such changes and modifications, insofar as they are not departures from the true scope of the invention, are intended to be covered by the following claims.

What is claimed is:

1. An electrical connector for use with a printed wiring board which includes a pair of planar surfaces, a plurality of metallized pads disposed adjacent the edge of at least one of said pair of surfaces, and an integral ground conductor plane; said electrical connector comprising:

an inner and an outer member formed of electrically insulative material, said inner member having a plurality of electrical contacts disposed respectively in said cells, each of said electrical contacts having an elongated tail section, each of said cells having a slot-like aperture in a rearward wall thereof for permitting the tail section of an electrical contact to protrude from said inner member, a longitudinal groove formed in said rearward wall of said inner member for receiving said edge of said printed wiring board, the elongated tail section of each of said contacts engaging one of said plurality of metallized pads of said printed wiring board and being affixed thereto, said outer member being comprised of a box-like structure open on one side to receive said inner member and having on its opposite side, a plurality of terminal-receiving apertures homologously positioned with respect to said cells in said inner member, means for fastening said connector to said printed wiring board comprising a ground conductor plane in the form of a metallic shell substantially enclosing said outer member and having a plurality of openings in alignment with said terminal-receiving apertures of said outer member, said metallic shell having a pair of coextensive extremities, said coextensive extremities being affixed to said printed wiring board by at least one metallic fastener, said fastener contacting said ground conductor plane of said printed wiring board, thereby electrically connecting the ground conductor planes of said connector and said printed wiring board.

2. An electrical connector as defined in claim 1 wherein each of said electrical contacts comprises a pair of opposed spring-like fingers terminating in said elongated tail section, said tail section being a narrowed extension of one of said fingers and being displaced from the longitudinal center-line thereof.

3. An electrical connector as defined in claim 2 wherein said plurality of cells are arranged in rows and columns, a pair of electrical contacts in a given column but adjacent rows having their longitudinal axes rotated 180 degrees with respect to each other, the respective tail sections of said pair of electrical contacts emerging from slot-like apertures in said rearward wall of said inner member in a spaced-apart relationship, said relationship conforming substantially to the spacing of said metallized pads on said printed wiring board.

4. An electrical connector as defined in claim 3 further characterized in that four rows of cells are present therein, said longitudinal groove formed in said rearward wall of said inner member being centrally situated, the respective tail sections of the electrical contacts in adjacent pairs of rows engaging respectively the metallized pads on respective opposite planar surfaces of said printed wiring board.

5. An electrical connector as defined in claim 4 wherein predetermined rows of cells and their associated electrical contacts are recessed with respect to those of the remaining rows in order to minimize pin-insertion forces.

* * * * *

UNITED STATES PATENT AND TRADEMARK OFFICE
CERTIFICATE OF CORRECTION

PATENT NO. : 4,418,972

DATED : Dec. 6, 1983

INVENTOR(S) : John E. Benasutti

It is certified that error appears in the above-identified patent and that said Letters Patent is hereby corrected as shown below:

The title page showing the illustrated figure should be deleted to appear as shown on the attached sheet.

The sheet of drawing should be deleted to be replaced with Figs. 1-5 as shown on the attached sheet.

Signed and Sealed this

Twelfth Day of February 1985

[SEAL]

Attest:

DONALD J. QUIGG

Attesting Officer

Acting Commissioner of Patents and Trademarks

United States Patent [19]

Benasutti

[11] 4,418,972
[45] Dec. 6, 1983

[54] ELECTRICAL CONNECTOR FOR PRINTED WIRING BOARD

[75] Inventor: John E. Benasutti, North Wales, Pa.

[73] Assignee: Burroughs Corporation, Detroit, Mich.

[21] Appl. No.: 344,490

[22] Filed: Feb. 1, 1982

[51] Int. Cl.³ .............................................. H01R 9/09
[52] U.S. Cl. ............................ 339/14 R; 339/17 LM; 339/176 MP; 339/207 R
[58] Field of Search .......... 339/17 LC, 17 LM, 17 M, 339/75 M, 75 MP, 176 M, 176 MP, 14 R, 206 R, 207 R

[56] References Cited

U.S. PATENT DOCUMENTS

| | | | |
|---|---|---|---|
| 2,658,183 | 11/1953 | Klostermann et al. | 339/207 R |
| 3,149,893 | 9/1964 | Dupre | 339/17 LM |
| 3,634,816 | 1/1972 | Zell | 339/17 M |
| 3,660,803 | 5/1972 | Cooney | 339/17 LM |
| 3,871,728 | 3/1975 | Goodman | 339/14 R |
| 3,876,274 | 4/1975 | Ruehlemann et al. | 339/207 R |
| 3,966,290 | 6/1976 | Little et al. | 339/17 LC |
| 4,243,283 | 1/1981 | McSparran | 339/14 R |
| 4,314,736 | 2/1982 | Demnianiuk | 339/75 MP |

FOREIGN PATENT DOCUMENTS 1232014  4/1960  France .................. 339/17 LC

Primary Examiner—John McQuade
Assistant Examiner—Gary F. Paumen
Attorney, Agent, or Firm—Francis A. Varallo; Edmund M. Chung; Kevin R. Peterson

[57] ABSTRACT

The present disclosure describes an electrical connector for use with a printed wiring board. The connector design is characterized by an inner housing of insulative material for supporting a plurality of electrical contacts and an outer insulative structure which encloses the housing and is easily removable therefrom. The latter permits the cleaning of the electrical contacts after a soldering operation and also allows for the replacement of individual defective contacts. Additionally, if required for impedance or electrical interference considerations, the present connector utilizes an integral ground conductor plane which substantially encloses its outer insulative structure and is electrically connected to the ground plane of the printed wiring board.

5 Claims, 5 Drawing Figures

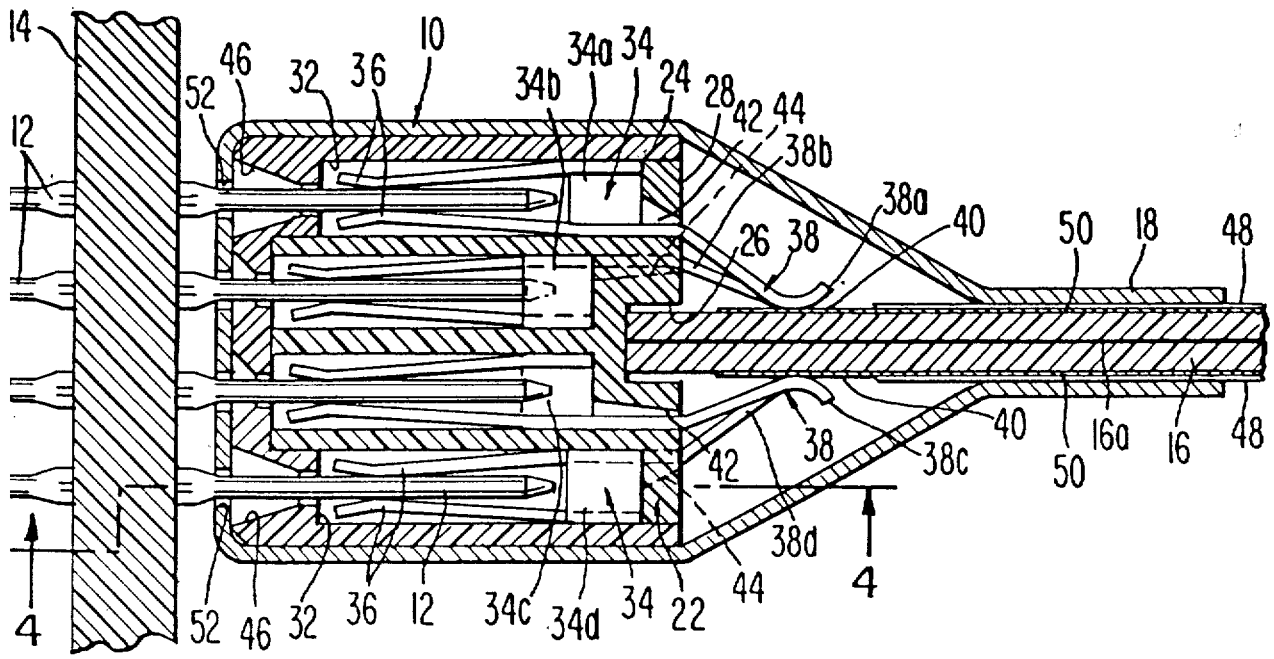

Pat. No. 4,418,972